(12) United States Patent
Liggenstorfer-Heimlicher et al.

(10) Patent No.: US 10,271,444 B2
(45) Date of Patent: Apr. 23, 2019

(54) PROXIMITY SENSOR

(71) Applicant: OPTOSYS SA, Corminboeuf (CH)

(72) Inventors: Annette Liggenstorfer-Heimlicher, Klichberg (CH); Roland Bochud, Noréaz (CH); Laurent Genilloud, Romont (CH)

(73) Assignee: OPTOSYS SA (CH)

( * ) Notice: Subject to any disclaimer, the term of this patent is extended or adjusted under 35 U.S.C. 154(b) by 0 days.

(21) Appl. No.: 15/990,988

(22) Filed: May 29, 2018

(65) Prior Publication Data

US 2018/0376605 A1    Dec. 27, 2018

(30) Foreign Application Priority Data

Jun. 21, 2017  (EP) .................................... 17177196

(51) Int. Cl.
*H05K 5/02* (2006.01)
*H05K 1/18* (2006.01)
(Continued)

(52) U.S. Cl.
CPC ........... *H05K 5/0226* (2013.01); *H05K 1/189* (2013.01); *H05K 5/03* (2013.01); *G01V 3/08* (2013.01);
(Continued)

(58) Field of Classification Search
USPC ................................................ 361/749, 748
See application file for complete search history.

(56) References Cited

U.S. PATENT DOCUMENTS 9,239,221 B2   1/2016 Heimlicher
9,541,371 B2   1/2017 Pettersson et al.
(Continued)

FOREIGN PATENT DOCUMENTS

AU   2013270535 A1   1/2014
EP   2 677 270 A1   12/2013
(Continued)

OTHER PUBLICATIONS

European Search Report dated Dec. 7, 2017 in corresponding European Patent Application No. 17177196.7.

*Primary Examiner* — Andargie M Aychillhum
(74) *Attorney, Agent, or Firm* — Ostrolenk Faber LLP (57) ABSTRACT

The present disclosure relates to a proximity sensor for detecting the proximity of an object, the sensor including a sensing element (11), a detection circuitry (65), and a housing (5), the sensing element (11) being arranged in a front portion (21) of the housing (5) such that it is adapted to interact with the object through the front portion (21) and the detection circuitry being interconnected with the sensing element (11) in order to receive a detection signal from the sensing element (11), wherein the detection circuitry (65) is provided on a circuit board (15, 15A, 15B, 15C) extending at least through a middle portion (22) of the housing (5).
To allow a better flexibility of the sensor along its length expansion, it is proposed that the housing (5) includes multiple segments (41, 42, 43, 44) that are consecutively arranged in a longitudinal direction (27) from a rear end (56) toward a front end (55) of the housing (5), wherein neighboring segments of said segments (41, 42, 43, 44) are linked to each other via a respective pivot axis (35, 39, 40) extending transversely with respect to said longitudinal direction (27), such that the housing (5) is bendable around each of said pivot axes (35, 39, 40), wherein both of said front portion (21) and said middle portion (22) each includes at least one of said segments (41, 42, 43, 44), and wherein the circuit board (15, 15A, 15B, 15C) includes at least one bendable section (61, 75, 76, 77, 85, 86) extending transversely with respect to said longitudinal direction (27), said bendable section (61, 75, 76, 77, 85, 86) being provided inside said neighboring segments (41, 42, 43, 44).

13 Claims, 3 Drawing Sheets

(51) Int. Cl.
*H05K 5/03* (2006.01)
*H05K 5/00* (2006.01)
*G01V 8/10* (2006.01)
*H05K 1/02* (2006.01)
*G01V 3/08* (2006.01)

(52) U.S. Cl.
CPC .............. *G01V 8/10* (2013.01); *H05K 1/028* (2013.01); *H05K 1/0278* (2013.01); *H05K 5/0034* (2013.01); *H05K 2201/10151* (2013.01)

(56) References Cited

U.S. PATENT DOCUMENTS

| | | | |
|---|---|---|---|
| 9,952,035 | B2 | 4/2018 | Uedaira |
| 2007/0235440 | A1* | 10/2007 | Gu ................. H05B 1/0244 219/482 |
| 2014/0239853 | A1* | 8/2014 | Woodham ........... F21V 33/0064 315/362 |
| 2016/0270234 | A1 | 9/2016 | Ahn |
| 2016/0271420 | A1 | 9/2016 | Pina |
| 2016/0356642 | A1 | 12/2016 | Uedaira |

FOREIGN PATENT DOCUMENTS

| | | |
|---|---|---|
| EP | 2 725 715 A1 | 4/2014 |
| EP | 3 068 198 A1 | 9/2016 |

\* cited by examiner

PROXIMITY SENSOR

FIELD OF THE INVENTION

The present invention relates to a proximity sensor for detecting the proximity of an object. The sensor comprises a sensing element, a detection circuitry, and a housing.

The sensing element is arranged in a front portion of the housing such that it is adapted to interact with the object through the front portion. The detection circuitry is interconnected with the sensing element in order to receive a detection signal from the sensing element. The detection circuitry is provided on a circuit board extending at least through a middle portion of the housing.

BACKGROUND OF THE INVENTION

A sensor of that type is know from EP 2 725 715 A1 to the same applicant. Typically, such a sensor has a length that is quite larger than the width and the height dimensions of the sensor's front portion. A housing geometry of that kind is needed to accommodate the detection circuitry behind the sensing element such that a measuring signal of good quality can be provided. But mostly the front portion is useful as an effective area for a detection of the presence or absence of an object. As a result, the sensor must be positioned in such a way that the sensor along its straight longitudinal expansion is pointing toward the object in order to ensure a functioning position of the sensor with the front portion facing the object.

Often, however, a certain degree of freedom would be desirable for allowing a more flexible handling of the sensor's length expansion behind the object. A simple example is the case, when there is only a small amount of space behind the object for which the sensor may be too long. Also in view of newer applications, a higher adaptability of the sensor's length expansion would be beneficial. Those include, for instance, a use of the sensor in robotic applications during which the sensor is continuously moved and may also be exposed to external forces. The high rigidity of the sensor along its length direction, however, does not only inhibit an exact positioning of the sensor's front portion with respect to a target area during such an external movement, which strongly compromises its detection reliability, but also poses the risk of damaging the sensor, in particular during a forcibly actuated bending of the sensor.

SUMMARY OF THE INVENTION

It is an object of the present invention to remedy at least one of the above mentioned disadvantages and to provide the initially addressed proximity sensor with an increased flexibility along its length expansion. It is another object to provide a good protection for such a sensor against harmful external influences, thus allowing in particular a reliable sensor operation during and after a bending of the sensor.

At least one of these objects is achieved by a proximity sensor according to the present invention.

The invention proposes, on the one hand, that the housing comprises multiple segments that are consecutively arranged in a longitudinal direction from a rear end toward a front end of the housing. Neighboring segments of these segments are linked to each other via a respective pivot axis extending transversely with respect to the longitudinal direction, such that the housing is bendable around each of these pivot axes. The front portion and the middle portion each comprises at least one of these segments. On the other hand, the circuit board comprises at least one bendable section extending transversely with respect to the longitudinal direction. The bendable section is provided inside the neighboring segments. In this way, the flexibility of the sensor along its length expansion in the longitudinal direction can be increased, thus allowing in particular a bending of the sensor in its longitudinal direction of expansion.

The pivot axis is preferably provided by a rotational connection in between the neighboring segments. The rotational connection is preferably provided in opposing lateral side walls of the housing. In particular, the rotational connection is preferably provided at interlocking end portions of the neighboring segments. The interlocking end portions of the neighboring segments are preferably provided by two lateral side portions of each of the segments. The lateral side portions of one segment are preferably overlapping with the lateral side portions of the other segment in the longitudinal direction of the housing. Preferably, the lateral side portions of one segment encompass the lateral side portions of the other segment at the position of the rotational connection. The lateral side portions at the respective end portion of the neighboring segments thus preferably constitute together a portion of the lateral side walls in the longitudinal direction of the housing. At the overlapping lateral side portions, the neighboring segments are preferably joined via a snap fitting allowing their mutual rotation relative to the pivot axis.

Preferably, the rotational connection comprises a recess provided in one of said neighboring segments. More preferred, a recess is provided in both of the lateral side portions at an end portion of one of the neighboring segments that is overlapping with the lateral side portions at an end portion of the other of the neighboring segments. The recess is preferably circular. Preferably, a protrusion fitting the form of the recess is provided in the other of said neighboring segments. More preferred, a protrusion is provided in both of the lateral side portions of the end portion of the other of the neighboring segments. In this way, a positive mechanical engagement in between the recess and the form fitting protrusion is preferably provided at which a rotation of the neighboring segments around the pivot axis can be performed.

Preferably, the middle portion of the housing comprises at least two of said segments. In this way, a good flexibility of the sensor can be provided in a middle region of the sensor's length expansion that is most desirable for many applications. To this end, all segments in the middle portion preferably have substantially the same length in the longitudinal direction. Preferably, at least one segment comprised in the front portion of the housing is longer in said longitudinal direction than at least one segment comprised in the middle portion. The longer segment in the front portion preferably contains the sensing element. In this way, a sufficient amount of space can be provided for the sensing element. This allows an exact and fixed positioning of the sensing element inside the sensor's front portion that is desirable in order to achieve reliable detection results. According to a preferred configuration, the front portion of the housing comprises only one segment, in which the sensing element is arranged.

Preferably, the front portion comprises a front wall at the front end of the housing. The sensing element is preferably neighboring the front wall inside the front portion. Preferably, the proximity sensor further comprises a transmission cable. The transmission cable is preferably connected to the detection circuitry inside the housing and passes through a rear wall of the housing. The rear wall is preferably opposed to the front wall. The rear wall is preferably provided in a rear portion of the housing. The rear portion preferably comprises at least one of said segments. Preferably, the transmission cable is connected to the detection circuitry in the rear portion of the housing. Preferably, the length of the at least one segment of the rear portion substantially corresponds to the length of at least one segment in the middle portion of the housing. According to a preferred configuration, the rear portion of the housing comprises only one segment.

According to a preferred implementation, the housing has a total length in the longitudinal direction of at most 100 mm. In this implementation, a preferred width or diameter of the housing perpendicular to the longitudinal direction is at most 50 mm. Preferably, the segments are formed from a rigid material. The rigid material preferably comprises a plastic material, wherein also at least one of a ceramic and metallic material are conceivable, in particular in addition to the plastic material or as a main material of the segments.

Preferably, the segments have a substantially rectangular cross section. Preferably, a width of a shortest segment, the shortest segment having a smallest length of all segments in the longitudinal direction of the housing, is larger than a height of the shortest segment in a lateral direction perpendicular to the longitudinal direction, in which width of the smallest segment the at least one pivot axis is provided.

Correspondingly, a cross section of the housing is preferably substantially rectangular. Preferably, the total length of the housing in the longitudinal direction is larger than the width and the height of the housing. In this way, a good flexibility of the sensor can be provided that is sufficient for many applications. According to a preferred configuration, the housing comprises at least four segments and at least three pivot axes linking each two neighboring segments. This configuration has been found to provide good bending properties of the sensor and at the same time allows a simple handling of the sensor.

According to another preferred configuration, the segments have a substantially circular cross section. Correspondingly, also a cross section of the housing is preferably substantially circular. A circular cross section of the sensor can be desirable for applications in which the installation and/or handling of the sensor require a substantially cylindrical shape.

Preferably, the pivot axes are arranged in a common virtual plane. In this way, homogenous bending properties can be provided in the longitudinal direction of the housing. For the same purpose, the pivot axes are preferably substantially equidistantly spaced from one another. In this way, the bending properties of the sensor can be optimized.

Preferably, the circuit board is formed from a flexible plastic substrate. The flexible plastic substrate preferably comprises at least one of a polyimide, a polyether ether ketone (PEEK), and a polyester. The detection circuitry is preferably provided on the circuit board by printing, in particular screen printing, and/or by means of photolithography.

Preferably, the circuit board is spaced apart from opposing vertical side walls of the housing. The vertical side walls are preferably provided above and below the at least one pivot axis. In this way, a damaging of the detection circuitry resulting from an interaction with the vertical side walls during bending of the housing can be prevented. The spacing of the circuit board from the vertical side walls is preferably at least 2 mm, more preferred at least 5 mm. Preferably, a protection layer is provided in between the circuit board and the opposing vertical side walls. In this way, the protection of the detection circuitry from harmful external influences can be further improved. The protection layer is preferably provided by a molding compound surrounding the circuit board. The molding compound is preferably formed from an organic material, more preferred a polymer, in particular a polyurethane (PUR).

Preferably, the housing comprises an external cover surrounding the consecutively arranged segments. The external cover is preferably provided by a molding compound. The molding compound of the external cover of the housing is preferably chosen from a different material than the molding compound of the protection layer of the circuit board inside the housing. In this way, additional material properties can be advantageously combined to account for an advanced protection of the detection circuitry inside the housing. A preferred material of the molding compound of the external cover is a thermoplastic elastomer (TPE).

The front portion of the housing and the sensing element located inside the front portion are preferably configured such that the sensing element is adapted to interact with the object through the front portion. According to a first preferred configuration, the sensing element is adapted to interact with the object at least through the front wall of the front portion. According to a second preferred configuration, the sensing element is adapted to interact with the object at least through a side wall of the front portion, the side wall extending in the longitudinal direction of the housing. In particular, the sensing element is preferably adapted to interact with the object at least through a vertical and/or lateral side wall of the housing.

In general, the sensing element may be provided by any technical means allowing a detection of the proximity of an object through the front portion of the housing. According to a first preferred configuration, the sensing element is configured for generating a magnetic field, such that variations of this magnetic field induced by an external object can be detected. For instance, the sensing element may be provided by a coil. According to a second preferred configuration, the sensing element is provided by an optical emission source, such as a light emitting diode (LED), in order to detect variations of the emitted wave caused by an external object.

In the preferred configuration according to which the sensing element is provided by an emission source of a magnetic field, at least part of the front portion is preferably formed from a non-ferromagnetic material, in particular a synthetic or metallic material. In the preferred implementation according to which the sensing element is a light emission source, the front portion preferably comprises an aperture and/or a light transparent window. The light transparent window may be provided by a lens and/or a plate, in particular formed from a glass, ceramic or a synthetic material.

The present invention further relates to a kinematic chain comprising the proximity sensor according to the present invention. The movable constituent parts of the kinematic chain preferably comprise the segments of the sensor being linked via the at least one pivot axis. According to a first preferred configuration, the kinematic chain is actuated externally. For instance, the kinematic chain may be coupled to actuators of a robotic system. According to a second preferred configuration, at least one actuator for rotating at least one segment around the respective pivot axis is included inside the housing. The above described preferred features and advantages of the proximity sensor can be correspondingly applied to the kinematic chain.

BRIEF DESCRIPTION OF DRAWINGS

The invention is explained in more detail hereinafter by means of preferred embodiments with reference to the drawings which illustrate further properties and advantages of the invention. The following description of the preferred embodiments is not intended as a limitation of the scope of the invention that has been described more generally above and is solely defined by the claims. The figures, the description, and the claims comprise numerous features in combination that one skilled in the art may also contemplate separately and use in further appropriate combinations. In the drawings:

DETAILED DESCRIPTION

A proximity sensor 1, as depicted in FIGS. 1-5, comprises a sensing part 2, a detection part 3, a transmission cable 4, and a housing 5. Sensing part 2 comprises a sensing element 11. Detection part 3 comprises a detection circuitry provided on a circuit board 15. The detection circuitry on circuit board 15 is electrically connected to sensing element 11 in order to receive a detection signal from sensing element 11 and to convert it to a useful measuring signal that can be fed to a signal output provided by transmission cable 4.

Circuit board 15 is surrounded by a protection layer 17. Protection layer 17 has the first purpose to protect the detection circuitry provided on circuit board 15 from any contamination and may also be useful to provide an additional fixation of the detection circuitry on a surface of circuit board 15. Protection layer 17 has the second purpose to protect the detection circuitry from a mechanical impact. In particular, the mechanical impact can be caused by a bending of housing 5 leading to a corresponding bending of circuit board 15. To avoid any damaging of the detection circuitry that would result from such a bending, protection layer 17 provides a spacing of circuit board 15 and the detection circuitry provided thereon with respect to an inner surface of housing 5 that may be subject to the bending. Protection layer 17 is provided by a molding compound surrounding circuit board 15. In this way, an increased temperature resistance and/or water resistance of the detection circuitry can also be provided.

Housing 5 comprises a front portion 21, a middle portion 22, and a rear portion 23. Sensing element 11 is inserted into front portion 21. Front portion 21 comprises a front wall 25 constituting a front end 55 of housing 5. A front side of sensing element 11 is substantially adjoining an inner surface of front wall 25. Sensing element 11 is adapted to interact with an object that is located outside front portion 21, in particular in front of front wall 25. The field and/or radiation emitted by sensing element 11 can thus be transmitted through front portion 21, for instance through front wall 25.

A longitudinal direction 27 is defined as a direction of extension of housing 5 pointing toward front end 25. A length of housing 5 is defined as a total dimension of housing 5 in longitudinal direction 27. Two remaining directions that are perpendicular to longitudinal direction 27 are defining a vertical direction and a lateral direction. A width of housing 5 is defined as a total dimension of housing 5 in this vertical direction. A height of housing 5 is defined as a total dimension of housing 5 in this lateral direction. Housing 5 comprises opposing vertical side walls 28A, 28B extending in the vertical direction. Housing 5 comprises opposing lateral side walls 29A, 29B extending in the lateral direction.

Circuit board 15 fully extends through middle portion 22 in longitudinal direction 27 of housing 5. Sensing element 11 is arranged in front of circuit board 15 in longitudinal direction 27 of housing 5. According another implementation, at least a rear portion of sensing element 11 may be arranged on circuit board 15. According to another implementation, an entire length of sensing element 11 in longitudinal direction 27 of housing 5 may be disposed on circuit board 15. Circuit board 15 reaches into front portion 21 of housing 5.

Circuit board 15 is arranged substantially in the middle of the height of housing 5. Circuit board 15 is spaced from an inner surface of vertical side walls 28A, 28B of housing 5.

The bendable surface of circuit board 15, at which the detection circuitry is provided, extends in the longitudinal and vertical direction of housing 5. A width of circuit board 15, being defined as its total dimension in the vertical direction of housing 5, is smaller than the width of housing 5. Circuit board 15 is substantially centered inside housing 5 in the vertical direction of housing 5. Circuit board 15 is thus spaced from an inner surface of lateral side walls 29A, 29B of housing 5. The spacing of circuit board 15 from side walls 28A, 28B, 29A, 29B of housing 5 provides a protection of circuit board 15 and the detection circuitry disposed thereon against external mechanical impacts on housing 5.

Circuit board 15 also reaches into rear portion 23 of housing 5. Furthermore, a part of transmission cable 4 is provided in rear portion 23 of housing 5. Circuit board 15 is, at least in part, arranged in front of transmission cable 4 in longitudinal direction 27 of housing 5. Transmission cable 4 is electrically connected to the detection circuitry on circuit board 15. The electrical connection may be provided on circuit board 15 or further apart from circuit board 15. Rear portion 23 of housing 5 comprises a rear wall 31 located at its rear end 56. Rear wall 31 has an aperture 32 through which cable 4 passes from the inner space of housing 5 to the exterior. Aperture 32 is arranged in the center of rear wall 31. Thus, a measuring signal generated by the detection circuitry can be led out from housing 5 through transmission cable 4.

Front portion 21 and middle portion 22 of housing 5 are separate constituent parts that are linked via a first pivot axis 35. First pivot axis 35 is provided by a rotational connection 36 at which front portion 21 and middle portion 22 are joined. In this way, front portion 21 provides a first segment 41 of housing 5 that is rotatable around pivot axis 35 with respect to a second segment 42 of housing 5. Second segment 42 is included in middle portion 22 of housing 5.

Rotational connection 36 is provided in opposing lateral side walls 29A, 29B of housing 5. The surface part of lateral side walls 29A, 29B, in which rotational connection 36 is provided, is composed of mutually interlocking lateral side portions 45A, 45B, 46A, 46B provided at the neighboring ends of first segment 41 and second segment 42. First segment 41 comprises opposing lateral side portions 45A, 45B forming an outer section of each lateral side wall 29A, 29B. Correspondingly, second segment 42 comprises opposing lateral side portions 46A, 46B forming an inner section of each lateral side wall 29A, 29B. Lateral side portions 45A, 45B, 46A, 46B are thus overlapping in longitudinal direction 27 of housing 5 in such a way that lateral side portions 45A, 45B of first segment 41 encompass lateral side portions 46A, 46B of second segment 42 at the position of rotational connection 36.

Rotational connection 36 comprises a circular recess 37A, 37B provided on an inner surface of both opposing lateral side portions 45A, 45B of first segment 41. Circular recesses 37A, 37B penetrate a total thickness of lateral side portions 45A, 45B of first segment 41. According to another implementation, circular recesses 37A, 37B may only extend partially through lateral side portions 45A, 45B of first segment 41. Circular recesses 37A, 37B are thus facing each other in the direction of pivot axis 35. Rotational connection 36 further comprises a protrusion 38A, 38B provided on an outer surface of both opposing lateral side portions 46A, 46B of second segment 42. Protrusions 38A, 38B exhibit a shape of a part of a circle that is form fitting inside circular shaped recesses 37A, 37B. Protrusions 38 are pointing away from each at the position of pivot axis 35. Protrusions 38A, 38B are provided at corresponding positions than recesses 37A, 37B on pivot axis 35. Due to their form fitting shape, part-circular protrusions 38A, 38B are adapted to fit inside circular recesses 37A, 37B providing a positive mechanical engagement in between lateral side portions 45A, 45B, 46A, 46B of first segment 41 and second segment 42. Thus, first segment 41 and second segment 42 are joined via a snap fitting allowing a mutual rotation in between the neighboring segments 41, 42 relative to first pivot axis 35.

Pivot axis 35 extends transversely with respect to longitudinal direction 27 of housing 5. In the embodiment shown in FIGS. 1-5, pivot axis 35 substantially extends perpendicular with respect to longitudinal direction 27 in the vertical direction. According to another implementation, depending in particular on a desired application of sensor 1, pivot axis 35 may extend in a different transverse direction with respect to longitudinal direction 27 that is not perpendicular with respect to longitudinal direction 27 but has a different angle with respect to longitudinal direction 27. In this way, many different variations are conceivable for an advantageous flexibility of sensor 1 along longitudinal direction 27 of housing 5 in a desired bending direction.

Middle portion 22 of housing 5 comprises two segments including second segment 42, as described above, and a third segment 43. Second segment 42 and third segment 43 are linked via a second pivot axis 39. Second pivot axis 39 is provided substantially in the same manner than first pivot axis 35 described above. Thus, second pivot axis 39 is provided by another rotational connection 47 in lateral side walls 29A, 29B of housing 5. Second rotational connection 47 is correspondingly provided at mutually interlocking lateral side portions provided at neighboring ends of second segment 42 and third segment 43. Those mutually interlocking lateral side portions comprise circular recesses in the opposing lateral side portions of second segment 42 and corresponding circular protrusions in the opposing lateral side portions of third segment 43. The circular protrusions and circular recesses have a corresponding shape as circular recesses 37A, 37B and circular protrusions 38A, 38B of first rotational connection 36 described above, thus providing a positive mechanical engagement in between the interlocking lateral side portions of second segment 42 and third segment 43. In this way, second segment 42 and third segment 43 can be joined via a snap fitting allowing their mutual rotation relative to second pivot axis 39.

Rear portion 23 of housing 5 provides a fourth segment 44. Fourth segment 44 is linked to third segment 43 via a third pivot axis 40 in the above described manner by another rotational connection 48 of the two segments 43, 44. The third rotational connection 48 is provided in mutually interlocking lateral side portions located at the neighboring ends of third segment 43 and fourth segment 44. The assembly of third rotational connection 48 is analogous to first rotational connection 36 in between first segment 41 and second segment 42 and second rotational connection 47 in between second segment 42 and third segment 43, thus also providing a positive mechanical engagement in between the interlocking lateral side portions of third segment 43 and fourth segment 44. In this way, third segment 43 and fourth segment 44 can also be joined via a snap fitting allowing their mutual rotation relative to third pivot axis 40.

Segments 41, 42, 43, 44 are consecutively arranged in longitudinal direction 27 of housing 5. First segment 41 is arranged in front of second segment 42 that is arranged in front of third segment 43 being arranged in front of fourth segment. Each two neighboring segments of segments 41, 42, 43, 44 are linked via a respective pivot axis 35, 39, 40. First segment 41 is linked to second segment 42 via first pivot axis 35, second segment 42 is linked to third segment 43 via second pivot axis 39, and third segment 43 is linked to fourth segment 44 via third pivot axis 40. Pivot axes 35, 39, 40 are arranged in a common virtual plane one after another in longitudinal direction 27. Pivot axes 35, 39, 40 are provided substantially in the middle of the height of housing 5. Pivot axes 35, 39, 40 are equidistantly spaced from one another. The spacing in between pivot axes 35, 39, 40 is smaller than the width of housing 5. In this way, a good flexibility of the housing can be achieved by a respective rotation of the multiple segments 41, 42, 43, 44 around the pivot axes 35, 39, 40 at which they are linked. Pivot axes 35, 39, 40 are substantially equidistantly spaced from one another.

Figure 1:
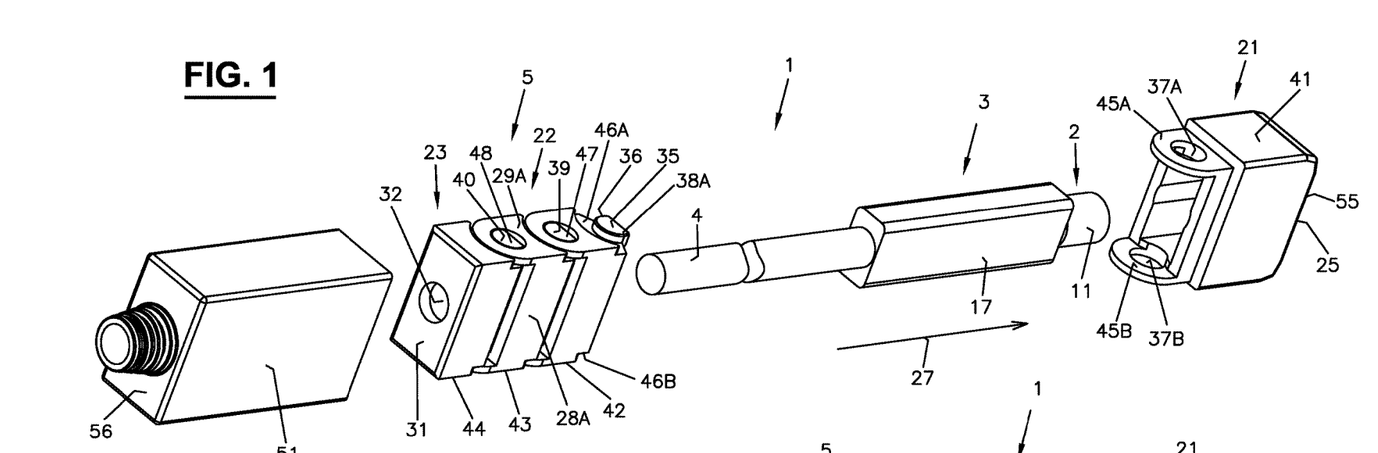
FIG. 1 is an exploded view of an embodiment of a proximity sensor according to the invention.
Figure 2:
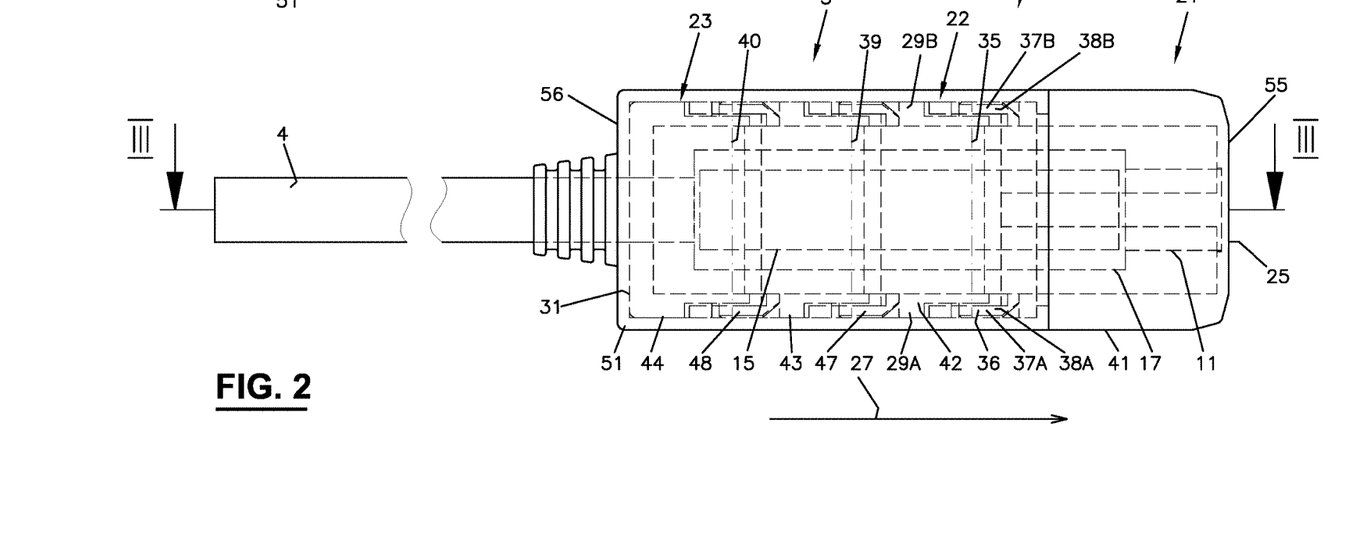
FIG. 2 is a top view of the proximity sensor shown in FIG. 1, in which internal constituent parts are indicated by dashed lines.
Figure 3:
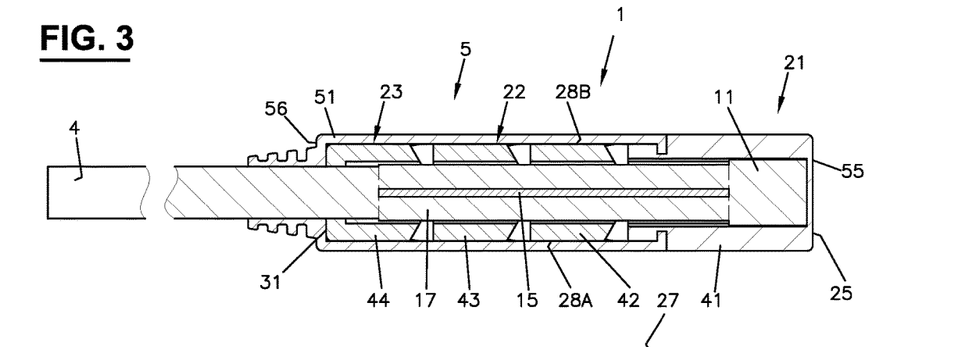
FIG. 3 is a longitudinal sectional view of the proximity sensor shown in FIGS. 1 and 2 along III in FIG. 2.
Figures 4, 5:
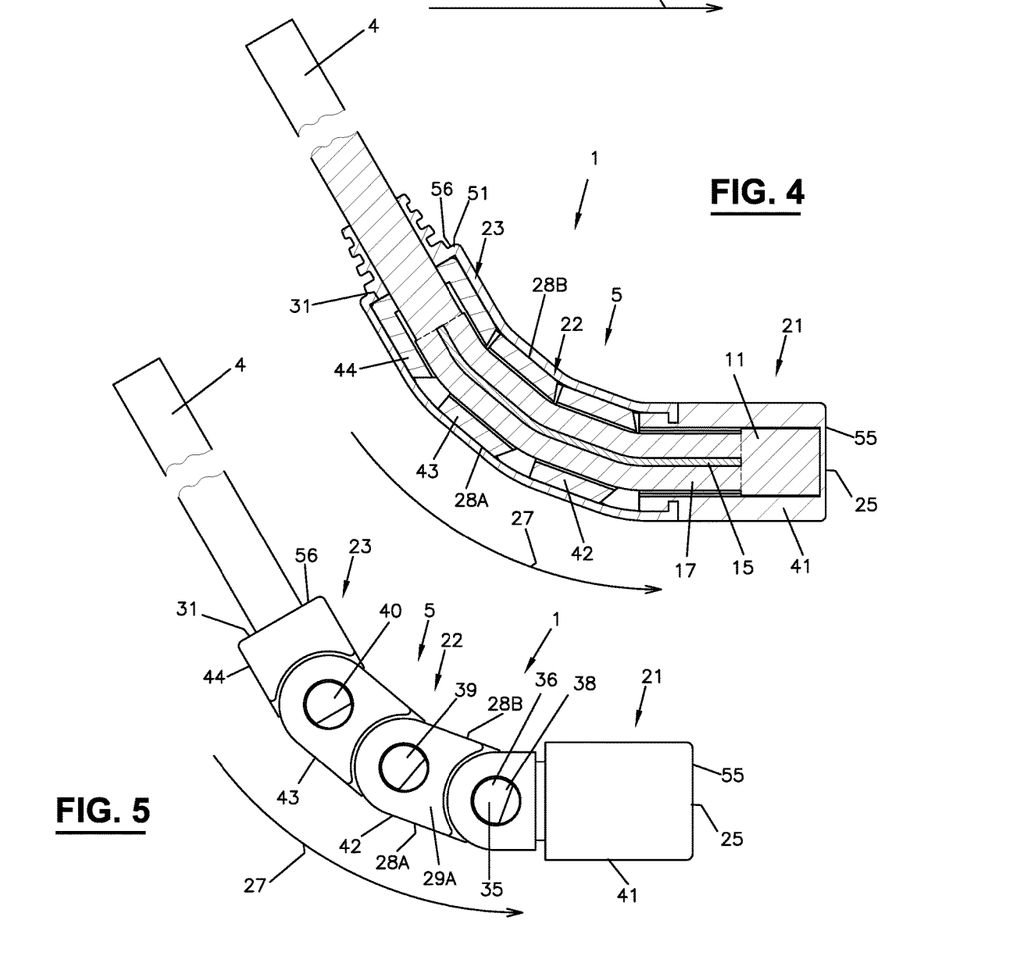
FIG. 4 is another longitudinal sectional view of the proximity sensor shown in FIGS. 1-3, wherein the proximity sensor is bent.
FIG. 5 is a side view of the proximity sensor shown in FIGS. 1-4 seen from a lateral perspective in the bent state according to FIG. 4, wherein an overmolding is not shown.

FIGS. 4 and 5 depict proximity sensor 1 in a bent state in which all segments 41, 42, 43, 44 are mutually rotated around their respective pivot axes 35, 39, 40 as compared to an unbent state of proximity sensor 1 in which all segments 41, 42, 43, 44 extend rectilinearly along a common virtual plane of vertical side walls 28A, 28B, as shown in FIGS. 2 and 3. As a result, longitudinal direction of extension 27 of housing 5 follows a curved line in the bent state of proximity sensor 1 as compared to a rectilinear direction of extension 27 in the unbent state of proximity sensor 1. Due to the possibility of bending each segment 41, 42, 43, 44 of proximity sensor 1 at various angles in two diametrically opposed directions, a high adaptability for positioning proximity sensor 1 in vicinity of an object to be monitored outside front portion 21 can be provided.

This can greatly facilitate the geometrical arrangement of proximity sensor 1 for diverse applications and also opens up new application areas. An example is a possible application of proximity sensor 1 in a robotic system in which a continuous movement of the robotic system in any transverse direction with respect to direction of extension 27 of housing 5 can be counterbalanced such that a desired orientation of sensing element 11 can be maintained. In particular, proximity sensor 1 may be attached to or integrated in a finger of a robotic hand. The above described flexibility of proximity sensor 1 is particularly suitable for mimicking the natural movements of a human finger and can therefore also be used as an integrated component of a robotic counterpart, in which such a human finger is replicated.

Housing 5 further comprises an external cover 51 for an outer protection, in particular against any contamination along the edges at which segments 41, 42, 43, 44 are neighboring each other. Cover 51 is formed by a molding compound substantially surrounding segments 41, 42, 43, 44 at their complete surface. Molding 51 is provided by a thermoplastic elastomer (TPE), providing a good insulation. Molding 51 is only shown in FIGS. 1-4 and not in FIG. 5, for a better illustration of the interaction between segments 41, 42, 43, 44 during bending of sensor 1.

Circuit board 15 is bendable at least with respect to longitudinal direction 27 of housing 5 along a surface, on which the detection circuitry is provided. More precisely, at least one bendable section of circuit board 15 is provided inside each two neighboring segments of the segments 41, 42, 43, 44.

Figures 6, 7:
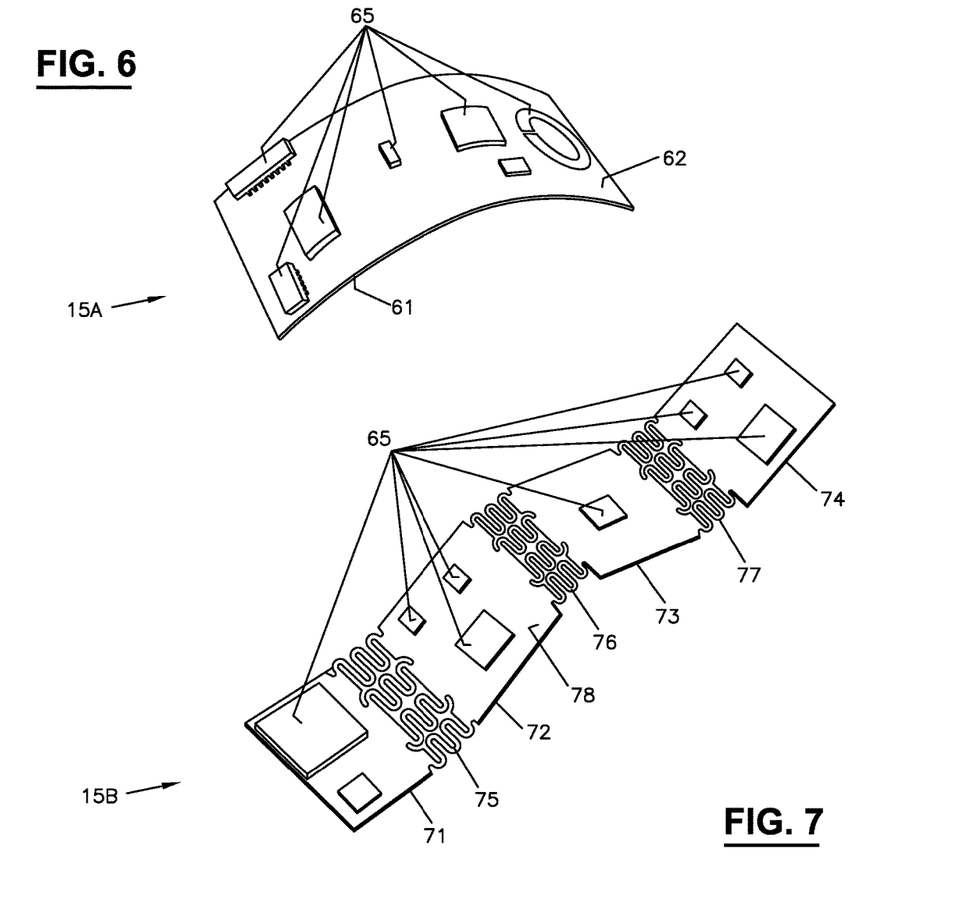
FIG. 6 is a perspective view of a circuit board according to a first configuration that can be applied in the proximity sensor shown in FIGS. 1-5.
FIG. 7 is a perspective view of a circuit board according to a second configuration that can be applied in the proximity sensor shown in FIGS. 1-5.
Figure 8:
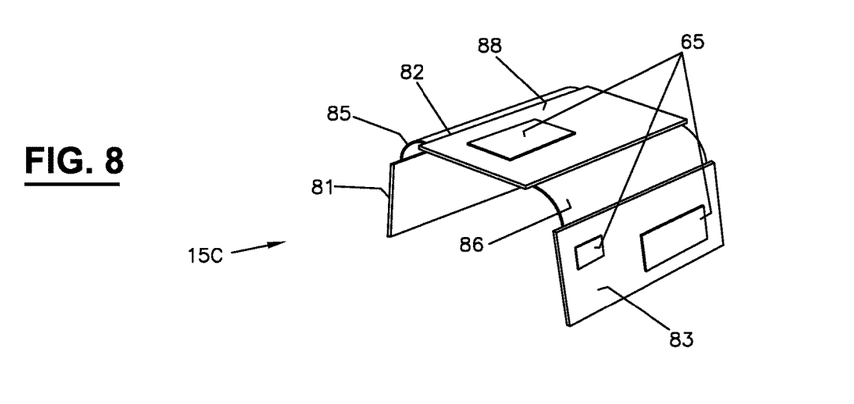
FIG. 8 is a perspective view of a circuit board according to a third configuration that can be applied in the proximity sensor shown in FIGS. 1-5.

FIGS. 6-8 depict various embodiments of bendable circuit boards 15A, 15B, 15C, that can be implemented in proximity sensor 1 in the place of circuit board 15 shown in FIGS. 1-5. Circuit board 15A shown in FIG. 6 is formed from a flexible plastic substrate 61. Substrate 61 has the shape of a plate. Therefore, flexible circuit board 15A is substantially bendable at each section of its surface 62 on which a detection circuitry 65 is provided. In order to protect detection circuitry 65 from harmful impacts, circuit board 15A is preferably surrounded by protection layer 17 before insertion into housing 5. When proximity sensor 1 is bent, as shown in FIGS. 4 and 5, flexible circuit board 15A is bent at least in a transition region between each neighboring segments 41, 42, 43, 44. In particular, flexible circuit board 15A may be continuously bent substantially over its total surface in longitudinal direction 27, for instance in a shape in which a longitudinal section of flexible circuit board 15A follows the curved line of longitudinal direction of extension 27 of housing 5 in the bent state of proximity sensor 1.

Circuit board 15B shown in FIG. 7 comprises four plate-shaped parts 71, 72, 73, 74 formed from a rigid material. Detection circuitry 65 is provided on a surface 78 of at least one or several rigid parts 71-74. Rigid parts 71-74 are consecutively arranged. Each two neighboring rigid parts 71-74 are interconnected via a metallic connection piece 75, 76, 77. Connection pieces 75-77 are flexible such that they can be bent along a transverse direction extending in between two neighboring rigid parts 71-74. When inserted into housing 5, in particular after surrounding circuit board 15B with protection layer 17, each rigid part 71-74 is arranged inside one of segments 41-44 and each of the connection pieces 75-75 is arranged inside two respective neighboring segments of segments 41-44, in particular inside a transition region of the respective neighboring segments 41-44. Thus, when sensor 1 is in a bent state, as shown in FIGS. 4 and 5, flexible connection pieces 75-77 are bent in the direction of longitudinal direction 27 of housing 5.

Circuit board 15c shown in FIG. 8 comprises three plate-shaped parts 81, 82, 83 formed from a rigid material with detection circuitry 65 provided on their surface 88. Rigid parts 81-83 are consecutively arranged and pairwise interconnected via flexible synthetic connection pieces 85, 86. When inserted into housing 5, in particular after surrounding circuit board 15C with protection layer 17, each rigid part 81-83 is arranged inside one of three subsequent segments 41-44. In particular, rigid parts 81-83 may be arranged inside segments 41-43 of front portion 21 and middle portion 22 of housing 5 or inside segments 42-44 of middle portion 22 and rear portion 23 of housing 5. Each of the connection pieces 85, 86 is arranged inside two respective neighboring segments of segments 41-44. Thus, when sensor 1 is in a bent state, as shown in FIGS. 4 and 5, flexible connection pieces 85, 86 are bent in the direction of longitudinal direction 27 of housing 5.

From the foregoing description, numerous modifications of the proximity sensor according to the invention are apparent to one skilled in the art without leaving the scope of protection of the invention that is solely defined by the claims.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A proximity sensor for detecting the proximity of an object, the sensor comprising a sensing element, a detection circuitry, and a housing, the sensing element being arranged in a front portion of the housing such that it is adapted to interact with the object through the front portion and the detection circuitry being interconnected with the sensing element in order to receive a detection signal from the sensing element, wherein the detection circuitry is provided on a circuit board extending at least through a middle portion of the housing, wherein the housing comprises multiple segments that are consecutively arranged in a longitudinal direction from a rear end toward a front end of the housing, wherein neighboring segments of said segments are linked to each other via a respective pivot axis extending transversely with respect to said longitudinal direction, such that the housing is bendable around each of said pivot axes, wherein both of said front portion and said middle portion each comprises at least one of said segments, and wherein the circuit board comprises at least one bendable section extending transversely with respect to said longitudinal direction, said bendable section being provided inside said neighboring segments, wherein said pivot axis is provided by a rotational connection in between said neighboring segment, the rotational connection being provided in opposing lateral side walls of the housing, wherein said rotational connection comprises at least one recess provided in one of said neighboring segments and at least one protrusion fitting a form of said recess and being provided in the other of said neighboring segments such that a positive mechanical engagement in between said recess and said form fitting protrusion is provided.

2. The proximity sensor according to claim 1, wherein said middle portion comprises at least two of said segments.

3. The proximity sensor according to claim 1, wherein the housing comprises at least four of said segments and three pivot axes linking each two neighboring segments.

4. The proximity sensor according to claim 3, wherein the pivot axes are arranged in a common virtual plane.

5. The proximity sensor according to claim 3, wherein the pivot axes are substantially equidistantly spaced from one another.

6. The proximity sensor according to claim 1, wherein the circuit board is a flexible circuit board.

7. The proximity sensor according to claim 1, wherein at least one of said segments comprised in said front portion is longer in said longitudinal direction than at least one of said segments comprised in said middle portion.

8. The proximity sensor according to claim 1, wherein it further comprises a transmission cable, the transmission cable being connected to said detection circuitry inside the housing and passing through a rear wall at a rear end of the housing.

9. The proximity sensor according to claim 1, wherein said circuit board is spaced apart from opposing vertical side walls of the housing, the vertical side walls being provided above and below said at least one pivot axis.

10. The proximity sensor according to claim 9, wherein a protection layer is provided in between said circuit board and said opposing vertical side walls.

11. The proximity sensor according to claim 10, wherein said protection layer is provided by a molding compound surrounding said circuit board.

12. The proximity sensor according to claim 1, wherein the housing comprises an external cover surrounding said segments.

13. The proximity sensor according to claim 12, wherein the external cover is provided by a molding compound.

* * * * *